(12) United States Patent
You et al.

(10) Patent No.: US 8,169,018 B2
(45) Date of Patent: May 1, 2012

(54) NON-VOLATILE MEMORY DEVICE

(75) Inventors: Jang-hyun You, Seoul (KR); Jin-taek Park, Suwon-si (KR); Young-woo Park, Seoul (KR); Jung-dal Choi, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 202 days.

(21) Appl. No.: 12/713,736

(22) Filed: Feb. 26, 2010

(65) Prior Publication Data

US 2011/0084329 A1    Apr. 14, 2011

(30) Foreign Application Priority Data

Oct. 9, 2009    (KR) .................. 10-2009-0096399

(51) Int. Cl.
*H01L 29/792*    (2006.01)
(52) U.S. Cl. ........ 257/326; 257/324; 257/384; 257/314; 257/E29.309; 257/E21.68; 438/258; 438/261
(58) Field of Classification Search .................. 257/314, 257/324, 326, 384, E29.309, E21.68; 438/258, 438/259, 261
See application file for complete search history.

(56) References Cited

U.S. PATENT DOCUMENTS

2007/0252194 A1*    11/2007    Shin et al. ............ 257/326
2011/0037118 A1*    2/2011    Kim et al. ............ 257/324

FOREIGN PATENT DOCUMENTS

| JP | 2009-054942 | 3/2009 |
| KR | 100760633 | 9/2007 |
| KR | 1020090029035 | 3/2009 |

* cited by examiner

*Primary Examiner* — Cuong Q Nguyen
*Assistant Examiner* — Cathy N Lam
(74) *Attorney, Agent, or Firm* — F. Chau & Associates, LLC

(57) ABSTRACT

A non-volatile memory device includes a semiconductor layer including a cell region and a peripheral region, a cell region gate structure disposed in the cell region of the semiconductor layer, and wherein the cell region gate structure includes a tunneling insulating layer and a first blocking insulating layer, a second blocking insulating layer, and a third blocking insulating layer. The no-volatile memory device further includes a peripheral region gate structure formed in the peripheral region of the semiconductor layer. The peripheral region gate structure includes a first peripheral region insulating layer including a same material as a material included in the tunneling insulating layer and a second peripheral region insulating layer including a same material as a material included in the third blocking insulating layer.

19 Claims, 12 Drawing Sheets

NON-VOLATILE MEMORY DEVICE

CROSS-REFERENCE TO RELATED APPLICATIONS

This application claims priority to Korean Patent Application No. 10-2009-0096399, filed on Oct. 9, 2009, the disclosure of which is hereby incorporated by reference herein in its entirety.

BACKGROUND (i) Technical Field

The present disclosure relates to a non-volatile memory device, and more particularly, to a non-volatile memory device manufactured by forming gate structures having different structures in different regions in the same process.

(ii) Description of the Related Art

Non-volatile memory semiconductor devices may include a cell region gate structure formed in a cell region and a peripheral region gate structure formed in a peripheral region. In general, the cell region gate structure may further include a charge storage layer, and thus the cell region gate structure and the peripheral region gate structure may be formed in different regions and have different structures. Also, the cell region gate structure and the peripheral region gate structure may be formed using separate processes.

SUMMARY

In accordance with an exemplary embodiment of the inventive concept, a non-volatile memory device is provided. The non-volatile memory device includes a semiconductor layer comprising a cell region and a peripheral region, a cell region gate structure disposed in the cell region of the semiconductor layer, wherein the cell region gate structure comprises a tunneling insulating layer and a first blocking insulating layer, a second blocking insulating layer, and a third blocking insulating layer. The non-volatile memory device further includes a peripheral region gate structure formed in the peripheral region of the semiconductor layer. The peripheral region gate structure comprises a first peripheral region insulating layer comprising a same material as a material included in the tunneling insulating layer and a second peripheral region insulating layer comprising a same material as a material included in the third blocking insulating layer.

In some embodiments, the first peripheral region insulating layer and the second peripheral region insulating layer may constitute a peripheral region gate insulating layer.

In some embodiments, a thickness of the third blocking insulating layer may be equal to a thickness of the second peripheral region insulating layer. A thickness of the second blocking insulating layer may be equal to or greater than a thickness of the third blocking insulating layer.

In some embodiments, the second blocking insulating layer and the third blocking insulating layer may each include a high-k dielectric material. The second blocking insulating layer and the third blocking insulating layer may each include a same material as one another. The second blocking insulating layer and the third blocking insulating layer may each include different materials from one another. At least one of the second blocking insulating layer and the third blocking insulating layer may include at least one selected from the group consisting of an aluminum oxide ($Al_2O_3$), a titanium oxide ($Ta_2O_3$), a titanium oxide ($TiO_2$), a yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide (LaAlO), a lanthanum hafnium oxide (LaHfO), a hafnium aluminum oxide (HfAlO), and a praseodymium oxide ($Pr_2O_3$).

In some embodiments, the peripheral region may include a low-voltage peripheral region and a high-voltage peripheral region. The high-voltage peripheral region may further include a buffer insulating layer disposed between the semiconductor layer and the first peripheral region insulating layer.

In some embodiments, the third blocking insulating layer and the second peripheral region insulating layer may be formed in a same process. A thickness of the tunneling insulating layer may be equal to a thickness of the first peripheral region insulating layer. The first blocking insulating layer may include a silicon oxide.

In some embodiments, the non-volatile memory device may further include: a cell region gate electrode layer disposed on the third blocking insulating layer, and a peripheral region gate electrode layer disposed on the second peripheral region insulating layer. The cell region gate electrode layer and the peripheral region gate electrode layer may be formed in a same process as one another.

In some embodiments, the cell region may further include a charge storage layer disposed between the tunneling insulating layer and the first blocking insulating layer.

In accordance with an exemplary embodiment of the inventive concept, a non-volatile memory device is provided. The non-volatile memory device includes a semiconductor layer comprising a first region and a second region, a first region gate structure disposed in the first region of the semiconductor layer, wherein the first region gate structure comprises a plurality of first region insulating layers. The non-volatile memory device further includes a second region gate structure formed in the second region of the semiconductor layer and, wherein the second region gate structure comprises a plurality of second region insulating layers that comprise at least one of the plurality of first region insulating layers.

In some embodiments, the first region insulating layers and the second region insulating layers may each include a high-k dielectric insulating layer comprising a high-k dielectric material. The high-k dielectric insulating layer included in both the first region insulating layers and the second region insulating layers may have a same thickness in both the first region and the second region.

In accordance with another exemplary embodiment of the inventive concept, a non-volatile memory device is provided. The non-volatile memory device including: a semiconductor layer comprising a cell region and a peripheral region, a cell region gate structure disposed in the cell region of the semiconductor layer, wherein the cell region gate structure comprises a tunneling insulating layer, a charge storage layer, a first blocking insulating layer, a second blocking insulating layer, a third blocking insulating layer, and a gate electrode layer. The non-volatile memory device further includes a peripheral region gate structure formed in the peripheral region of the semiconductor layer, wherein the peripheral region gate structure comprises the tunneling insulating layer, the third blocking insulating layer, and the gate electrode layer.

BRIEF DESCRIPTION OF THE DRAWINGS

Exemplary embodiments of the inventive concept can be more understood in more detail from the following detailed description taken in conjunction with the accompanying drawings in which.

DETAILED DESCRIPTION OF THE EXEMPLARY EMBODIMENTS

Figure 1:
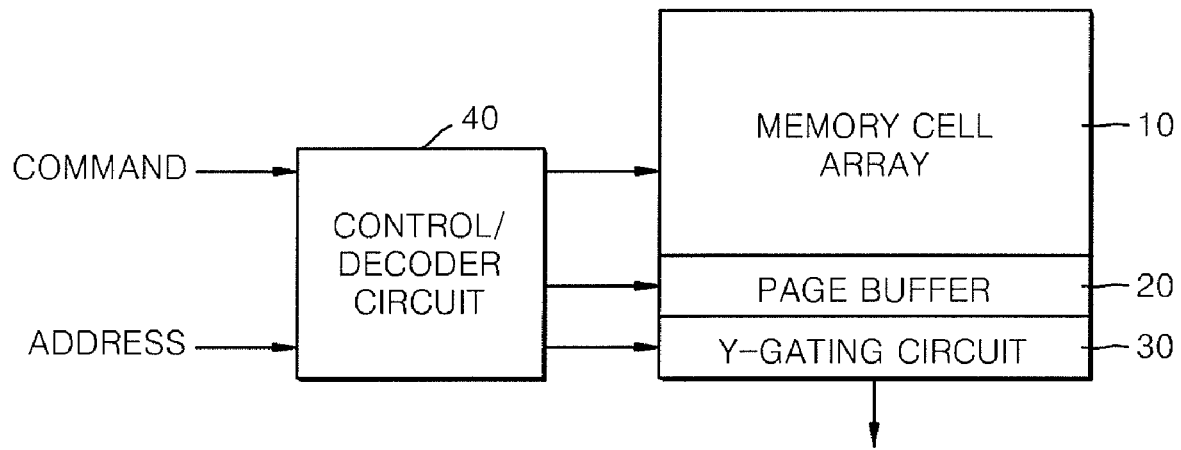
FIG. 1 is a block diagram of a non-volatile memory device according to an exemplary embodiment of the inventive concept.

Reference will now be made in detail to exemplary embodiments, examples of which are illustrated in the accompanying drawings. However, exemplary embodiments are not limited to the embodiments illustrated hereinafter. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of a nonvolatile memory device according to an embodiment of the present invention.

Referring to FIG. 1, the nonvolatile memory device may include a memory cell array 10, a page buffer 20, a Y-gating circuit 30, and a control/decoder circuit 40.

The memory cell array 10 may include a plurality of memory blocks, and each of the plurality of memory blocks may include a plurality of nonvolatile memory cells. The nonvolatile memory cells may be flash memory cells, for example, NAND flash memory cells, or NOR flash memory cells. The page buffer 20 can, for example, temporarily store data to be written in the memory cell array 10, or data to be read from the memory cell array 10. The Y-gating circuitry 30 can, for example, transmit data stored in the page buffer 20. The control/decoder circuitry 40 can, for example, receive a command and an address from the outside, output a control signal to write data in the memory cell array 10 to read data from the memory cell array 10, and decode the address. The control/decoder circuitry 40 may, for example, output a control signal for input and output of data to the page buffer 20 and provide address information to the Y-gating circuitry 30.

Figure 2:
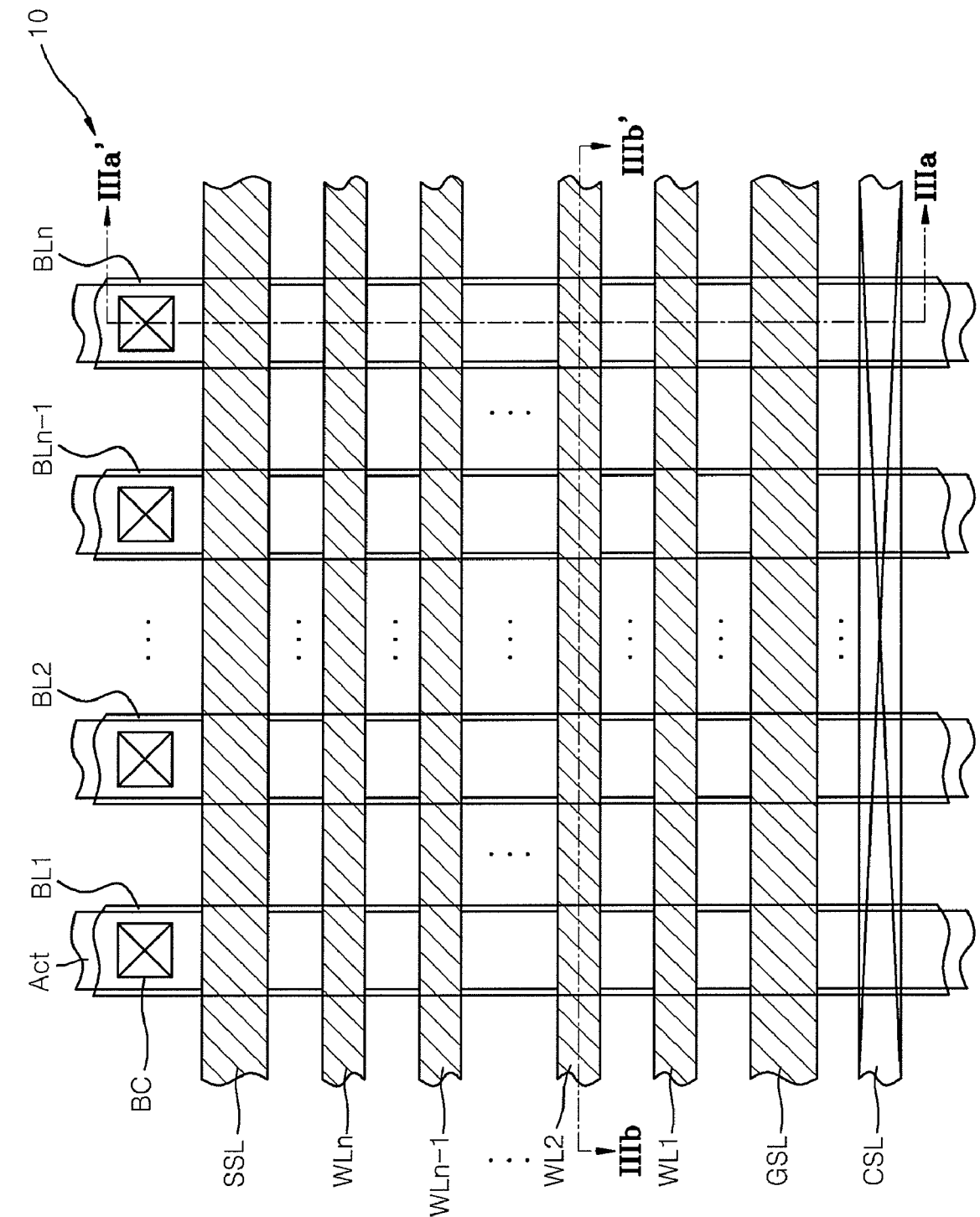
FIG. 2 is a layout of a part of a memory cell array of the non-volatile memory device illustrated in FIG. 1, according to an exemplary embodiment of the inventive concept.
Figure 3A:
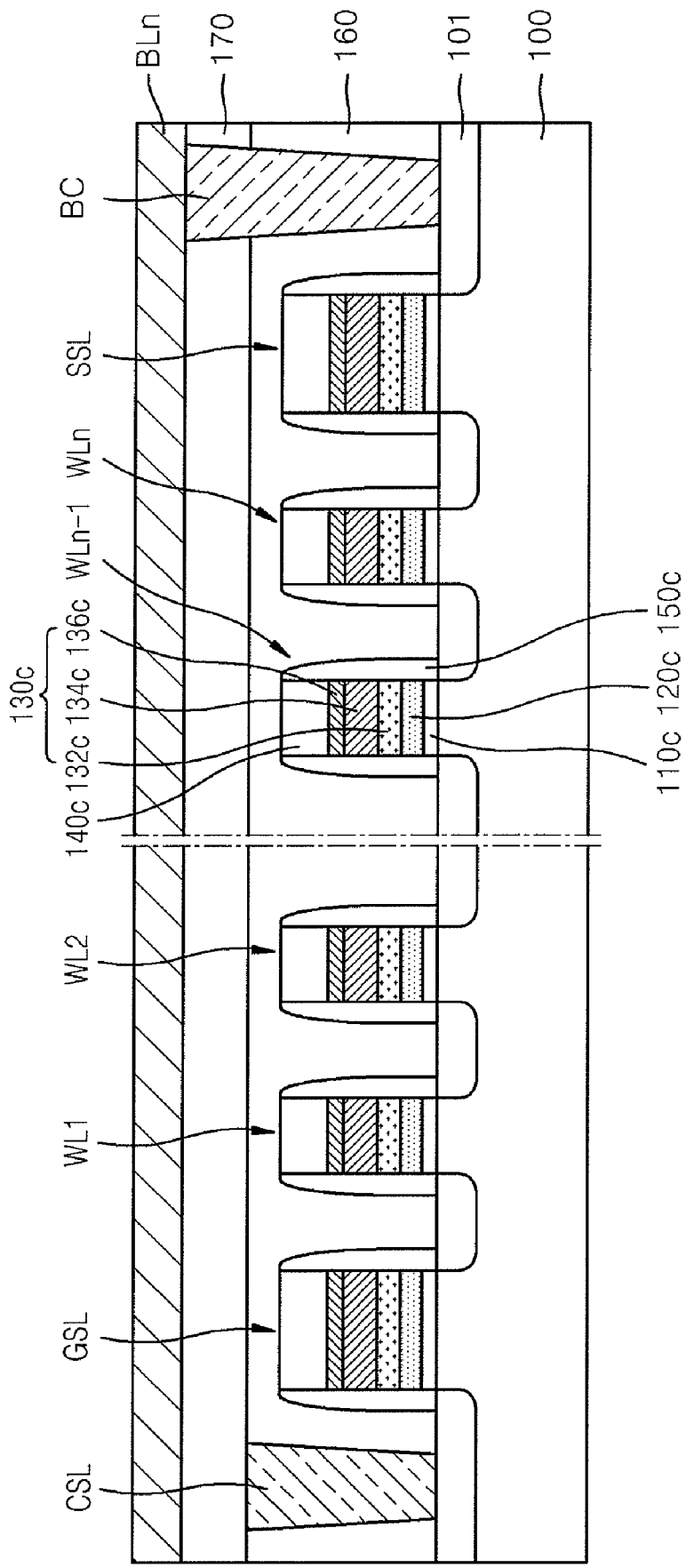
FIGS. 3A and 3B are cross-sectional views taken along lines IIIa-IIIa' and IIIb-IIIb' of FIG. 2, according to an exemplary embodiment of the inventive concept.
Figure 3B:
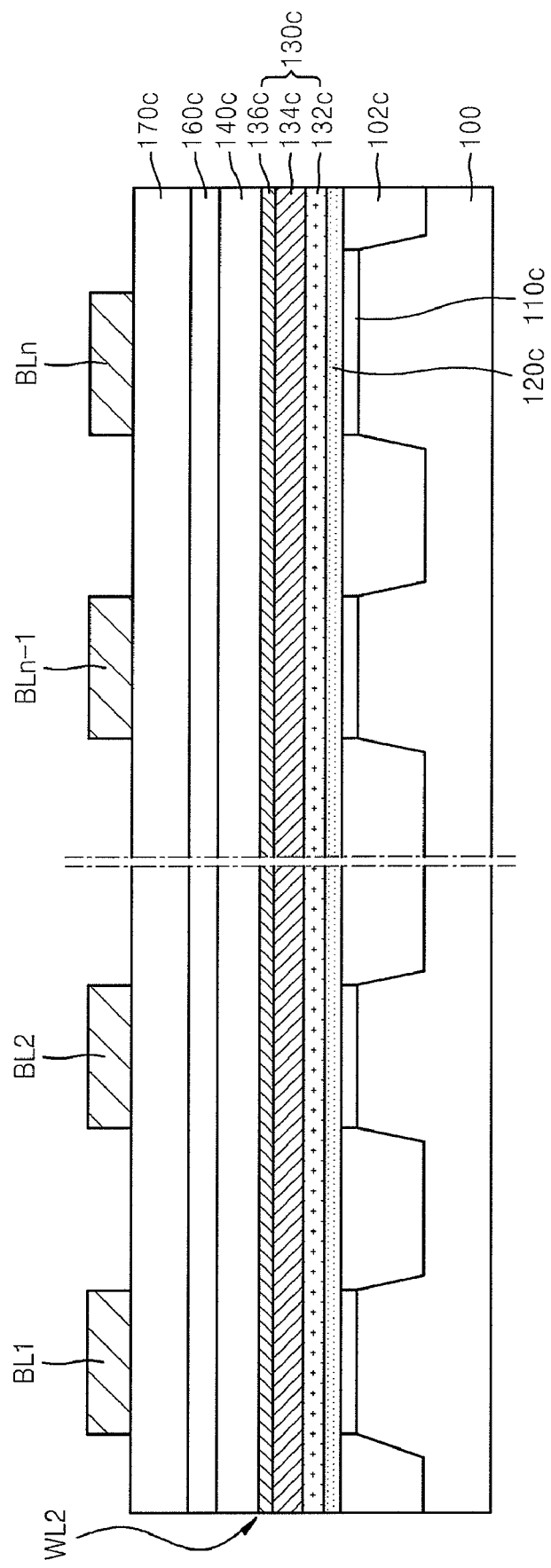

FIG. 2 illustrates the layout of a portion of a memory cell array according to an embodiment of the present invention. The portion of the memory cell array shown in FIG. 2 may be a portion of the memory cell array 10 in FIG. 1. FIGS. 3A and 3B are cross-sectional views taken along lines IIIa-IIIa' and IIIb-IIIb' of FIG. 2, respectively.

Referring to FIGS. 2 and 3A and 3B, the memory cell array 10 may include a plurality of active regions Act that are defined by device isolation regions 102c formed in a semiconductor layer 100. The semiconductor layer 100 can include, for example, a substrate and/or an epitaxial layer, a silicon-on-insulator (SOI) layer, semiconductor-on-insulator (SeOI) layer, or the like. The active regions Act may have the form of, for example, parallel lines.

A string selection line SSL and a ground selection line GSL may run across and over the active regions Act. A plurality of word lines WL1, WL2, . . . , WLn−1, and WLn may run across and over the active regions Act between the string selection line SSL and the ground selection line GSL. The string selection line SSL, the ground selection line GSL, and the word lines WL1, WL2, . . . , WLn−1, and WLn may be parallel to one another. Impurity regions 101 may be formed in the active regions Act adjacent to both sides of each of the word lines WL1, WL2, . . . , WLn−1, and WLn, the string selection line SSL, and the ground selection line GSL. As a result, a string selection transistor, cell transistors, and a ground selection transistor that are connected in series are formed. The string selection transistor, the ground selection transistor, and the cell transistors interposed therebetween may constitute a unit memory block. The impurity region 101 disposed adjacent to the string selection line SSL and opposite to the ground selection line GSL may be defined as a drain region of the string selection transistor. Also, the impurity region 101 disposed adjacent to the ground selection line GSL and opposite to the string selection line SSL may be defined as a source region of the ground selection transistor.

Each of the word lines WL1, WL2, . . . , WLn−1, and WLn may include a tunneling insulating layer 110c, a charge storage layer 120c, a blocking insulating layer 130c, and a cell region gate electrode layer 140c that are stacked sequentially on the semiconductor layer 100. Each of the word lines WL1, WL2, . . . , WLn−1, and WLn may further include a cell barrier conductive layer and a word line conductive layer that are stacked sequentially on the cell region gate electrode layer 140c.

Each of the tunneling insulating layer 110c and the charge storage layer 120c may be separated into portions with respect to the cell transistors disposed adjacently in the direction of the word lines WL1, WL2, . . . , WLn−1, and WLn. Top surfaces of the device isolation regions 102c may be at substantially the same level as a top surface of the charge storage layer 120c. The tunneling insulating layer 110c may be, for example, a silicon oxide layer. The charge storage layer 120c may be a charge trapping layer or a floating gate conductive layer. The blocking insulating layer 130c may be shared among the cell transistors disposed adjacently in the direction of the word lines WL1, WL2, . . . , WLn−1, and WLn. The blocking insulating layer 130c may have a multi-layer structure. In other words, the blocking insulating layer 130c may include, for example, first, second, and third blocking insulating layers 132c, 134c, and 136c. The first blocking insulating layer 132c may include, for example, a silicon oxide, and each of the second blocking insulating layer 134c and the third blocking insulating layer 136c may include, for example, a high-k dielectric. The blocking insulating layer 130c will be described in greater detail later. A spacer 150c may be disposed on, for example, side surfaces of the tunneling insulating layer 110c, the charge storage layer 120c, the blocking insulating layer 130c, and the cell region gate electrode layer 140c. The spacer 150c may be formed as a multi layer structure.

A string selection line SSL and a ground selection line GSL may have the same stacked structures as word lines WL1, WL2, . . . , WLn−1, and WLn as described above. For example, widths of the string selection line SSL and the ground selection line GSL may be greater than those of the word lines WL1, WL2, . . . , WLn−1, and WLn. However, the above is an exemplary embodiment, and the present invention is not limited thereto.

A first interlayer insulating layer 160c is provided on the word lines WL1, WL2, . . . , WLn−1, and WLn, the string selection line SSL and the ground selection line GSL. A common source line CSL is disposed through the first interlayer insulating layer 160c and connected to the source region of the ground selection line GSL. The common source line CSL may be disposed parallel to the ground selection line GSL. A second interlayer insulating layer 170c may be provided on the first interlayer insulating layer 160c. A bit line plug BC may be disposed through the second interlayer insulating layer 170c and the first interlayer insulating layer 160c and connected to the drain region of the string selection line SSL. Bit lines BL1, . . . , BL2, BLn−1, and BLn may be disposed on the second interlayer insulating layer 170c and connected to the bit line plug BC. Also, the bit lines BL1, BL2, . . . , BLn−1, and BLn run across and over the word lines WL1, WL2, . . . , WLn−1, and WLn. The bit lines BL1, BL2, . . . , BLn−1, and BLn may be disposed parallel to the active regions Act.

Figure 4:
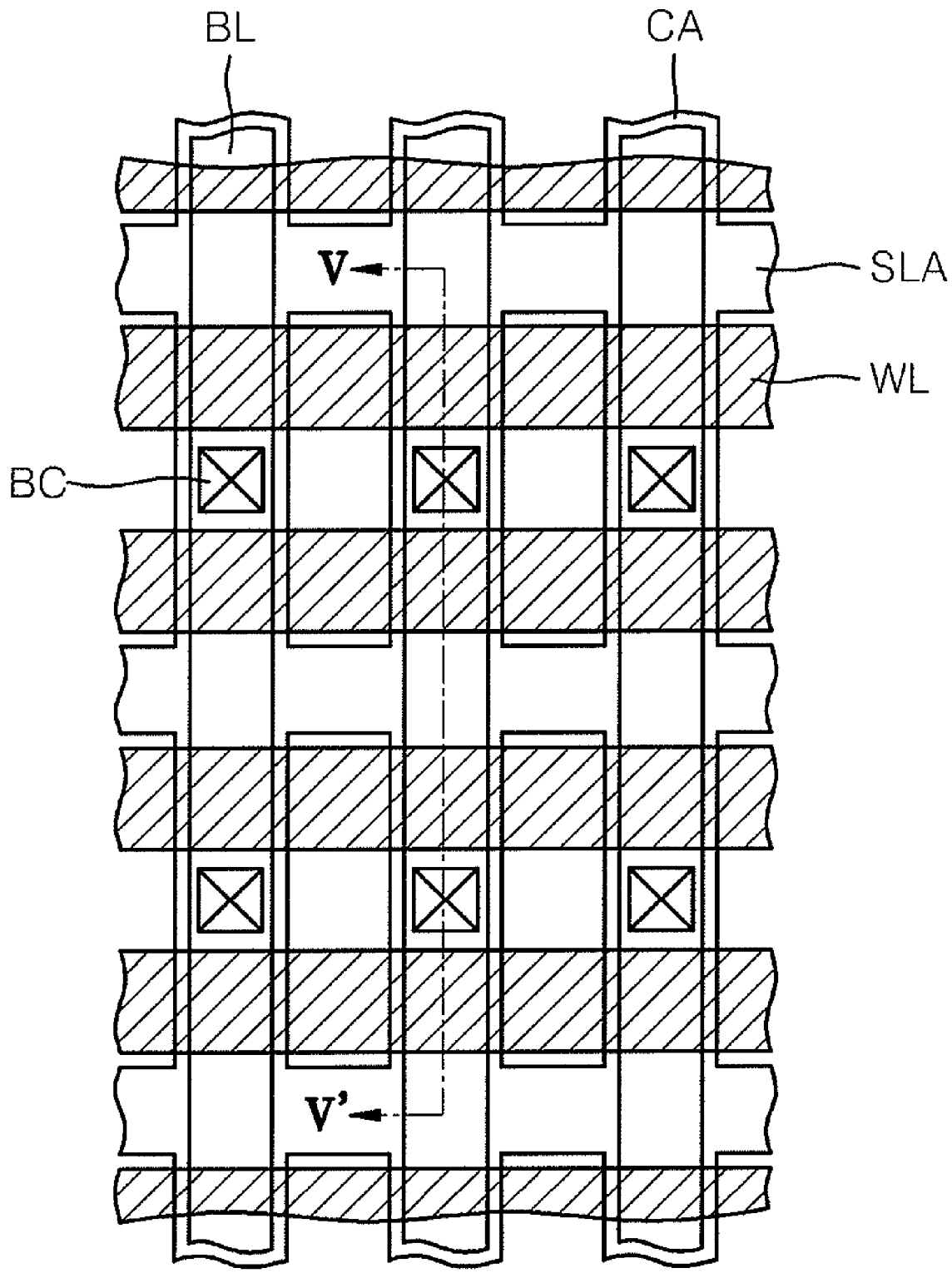
FIG. 4 is a layout of a part of a memory cell array of a non-volatile memory device according to an exemplary embodiment of the inventive concept.
Figure 5:
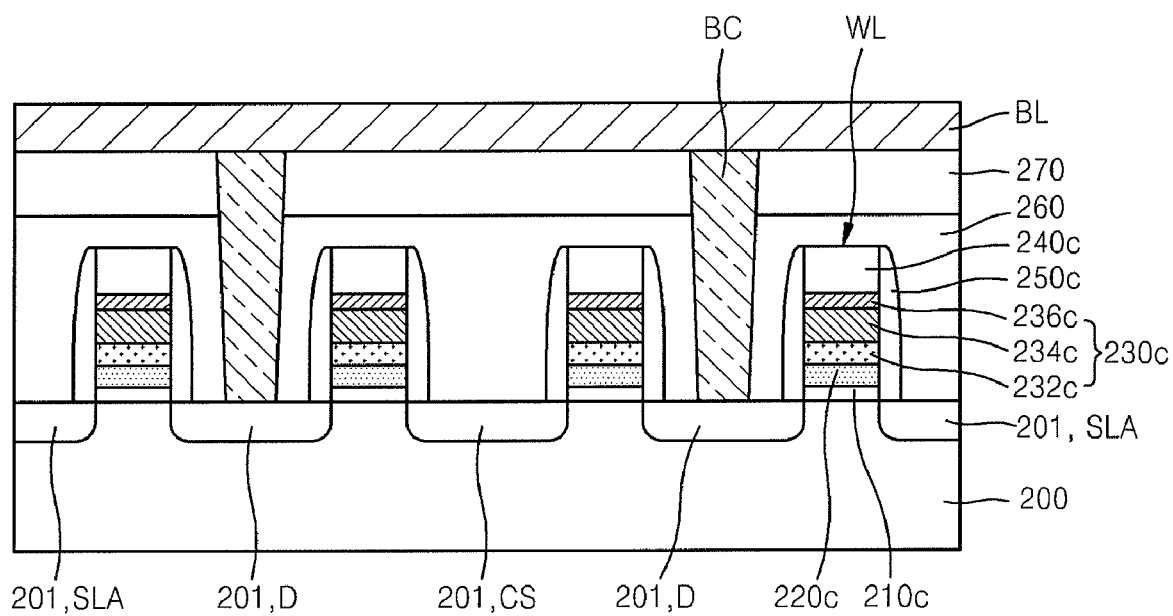
FIG. 5 is a cross-sectional view taken along a line V-V' of FIG. 4, according to an exemplary embodiment of the inventive concept.

FIG. 4 illustrates the layout of a portion of a memory cell array of a nonvolatile memory device according to an embodiment of the present invention. In the embodiments illustrated in FIG. 4, the memory cell array may be a NOR flash memory. FIG. 5 is a cross-sectional view taken along a line V-V' of FIG. 4.

Referring to FIGS. 4 and 5, an active region is defined by a device isolation layer foamed in a semiconductor layer 200. The active region includes a plurality of parallel common source line active regions SLA and a plurality of cell active regions CA disposed across the common source line active regions SLA.

A pair of word lines WL are disposed over each of the cell active regions CA and spaced apart from one another. The word lines WL are disposed adjacent to the common source line active regions SLA, respectively. Impurity regions 201 are formed in the cell active region CA and the common source line active region SLA that are exposed between the pair of word lines WL. As a result, a pair of cell transistors may be defined on each of the cell active regions CA. The impurity region 201 formed in the cell active region CA may be defined as a drain region D, while the impurity region 201 formed in the common source line active region SLA may be defined as a common source region CS.

Each of the word lines WL may include a tunneling insulating layer 210c, a charge storage layer 220c, a blocking insulating layer 230c, and a cell region gate electrode layer 240c that are stacked sequentially on the semiconductor layer 200. Each of the word lines WL may further include a barrier conductive layer and a word line conductive layer that are stacked sequentially on the cell region gate electrode layer 240c. The tunneling insulating layer 210c, the charge storage layer 220c, the blocking insulating layer 230c, and the cell region gate electrode layer 240c may be formed in a similar manner as the tunneling insulating layer 110c, the charge storage layer 120c, the blocking insulating layer 130c, and the cell region gate electrode layer 140c, respectively, which are described above with reference to FIGS. 2, 3A, and 3B. The blocking insulating layer 230c may have a multi-layer structure. In other words, the blocking insulating layer 230c may include, for example, first, second, and third blocking insulating layers 232c, 234c, and 236c. The first blocking insulating layer 232c may include, for example, a silicon oxide, and each of the second blocking insulating layer 234c and the third blocking insulating layer 236c may include, for example, a high-k dielectric. The blocking insulating layer 230c will be described in greater detail later. A spacer 250c may be disposed on, for example, side surfaces of the tunneling insulating layer 210c, the charge storage layer 220c, the blocking insulating layer 230c, and the cell region gate electrode layer 240c. The spacer 250c may be formed as a multi layer structure.

An interlayer insulating layer 260 may be provided on the word lines WL. A bit line plug BC may be disposed through the interlayer insulating layer 260 and connected to the drain region D. Bit lines BL may be disposed on the interlayer insulating layer 260 and connected to the bit line plug BC. The bit lines BL may run across and over the word lines WL. The bit lines BL may be disposed parallel to the cell active regions CA.

Figure 6:
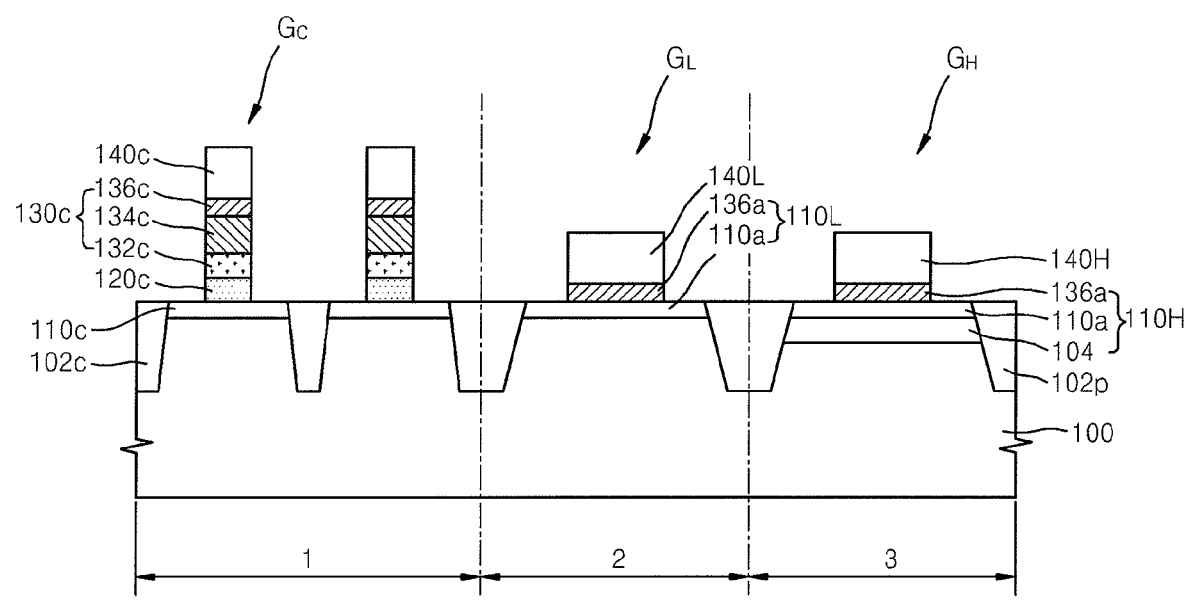
FIG. 6 is a cross-sectional view illustrating a non-volatile memory device according to an exemplary embodiment of the inventive concept.

FIG. 6 is a cross-sectional view illustrating a non-volatile memory device according to embodiments of the inventive concept.

Referring to FIG. 6, the non-volatile memory device according to embodiments may include a cell region gate structure $G_C$ and peripheral region gate structures $G_L$ and $G_H$ which are respectively formed on a semiconductor layer 100. The semiconductor layer 100 includes a cell region 1 and peripheral regions 2 and 3. The peripheral regions 2 and 3 may be a low-voltage peripheral region 2 and a high-voltage peripheral region 3, respectively. The peripheral region gate structures $G_L$ and $G_H$ may be a low-voltage peripheral region gate structure $G_L$ and a high-voltage peripheral region gate structure $G_H$, respectively. The low-voltage peripheral region 2 may be defined as a region where a transistor that requires a relatively low voltage is formed, and the high-voltage peripheral region 3 may be defined as a region where a transistor that requires a relatively high voltage is formed.

The cell region gate structure $G_C$ is formed in the cell region 1 of the semiconductor layer 100. The cell region gate structure $G_C$ may include a tunneling insulating layer 110c, a charge storage layer 120c, a blocking insulating layer 130c, and a cell region gate electrode layer 140c. The blocking insulating layer 130c may include, for example, first, second, and third blocking insulating layers 132c, 134c, and 136c. The first blocking insulating layer 132c may include, for example, a silicon oxide, and each of the second blocking insulating layer 134c and the third blocking insulating layer 136c may include, for example, a high-k dielectric. The second blocking insulating layer 134c and the third blocking insulating layer 136c may include the same material or different materials as one another. The thickness of the second blocking insulating layer 134c may be equal to or greater than the thickness of the third blocking insulating layer 136c.

The low-voltage peripheral region gate structure $G_L$ is formed in the low-voltage peripheral region 2 of the semiconductor layer 100. The low-voltage peripheral region gate structure $G_L$ may include a low-voltage peripheral region gate insulating layer 110L and a low-voltage peripheral region gate electrode layer 140L. The low-voltage peripheral region gate insulating layer 110L may include a first peripheral region insulating layer 110a and a second peripheral region insulating layer 136a.

The high-voltage peripheral region gate structure $G_H$ may be formed in the high-voltage peripheral region 3 of the semiconductor layer 100. The high-voltage peripheral region gate structure $G_H$ may include a high-voltage peripheral region gate insulating layer 110H and a high-voltage peripheral region gate electrode layer 140H. The high-voltage peripheral region gate insulating layer 110H may include a buffer insulating layer 104, the first peripheral region insulating layer 110a, and the second peripheral region insulating layer 136a. The buffer insulating layer 104 may be formed between the semiconductor layer 100 and the first peripheral region insulating layer 110a.

The tunneling insulating layer 110c and the first peripheral region insulating layer 110a may be formed in the same process and may include the same material as one another. Thicknesses of the tunneling insulating layer 110c and the first peripheral region insulating layer 110a may be the same as one another. The third blocking insulating layer 136c and the second peripheral region insulating layer 136a may be formed in the same process and may include the same material as one another. Thicknesses of the third blocking insulating layer 136c and the second peripheral region insulating layer 136a may be the same as one another. The low-voltage peripheral region gate insulating layer 110L and the high-voltage peripheral region gate insulating layer 110H may be formed in the same process and may include the same material and/or have the same thickness as one another. The cell region gate electrode layer 140c, the low-voltage peripheral region gate electrode layer 140L, and the high-voltage peripheral region gate electrode layer 140H may be formed in the same process and/or may include the same material and/or have the same thickness as one another.

FIGS. 7A through 7G are cross-sectional views for illustrating a method of manufacturing the non-volatile memory device illustrated in FIG. 6.

Figure 7A:
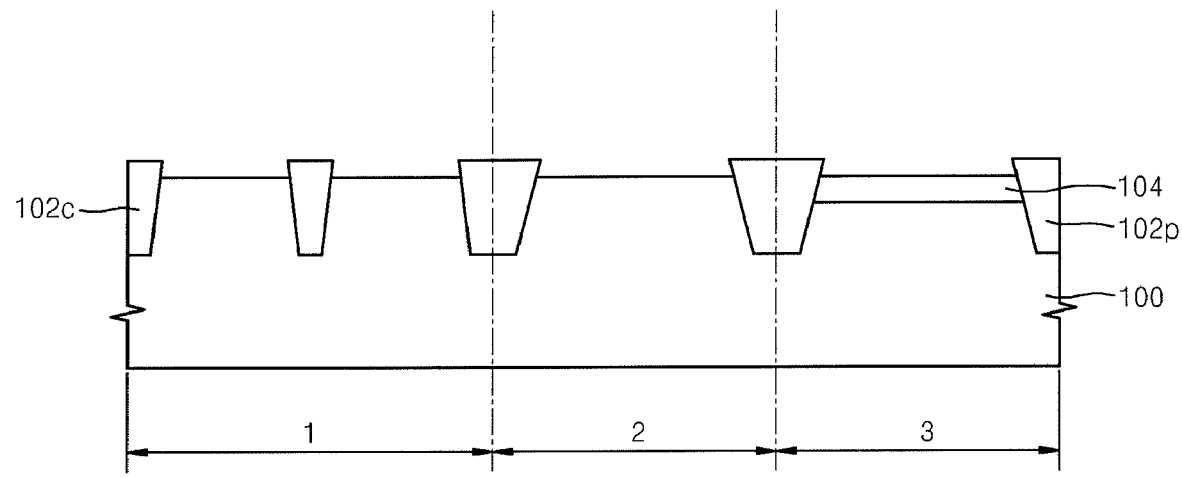
FIGS. 7A through 7G are cross-sectional views for illustrating a method of manufacturing the non-volatile memory device illustrated in FIG. 6.

Referring to FIG. 7A, the semiconductor layer 100 including the cell region 1 and the peripheral regions 2 and 3 is provided. The semiconductor layer 100 may include, for example, a substrate and/or epitaxial layer, a silicon-on-insulator (SOI) layer, and/or a semiconductor-on-insulator (SEOI) layer. The semiconductor layer 100 may include, for example, silicon-on-sapphire, germanium, silicon-germanium, or gallium-arsenide. The peripheral regions 2 and 3 may be the low-voltage peripheral region 2 and the high-voltage peripheral region 3, respectively.

A cell region isolation layer 102c is formed in the cell region 1, and a peripheral region isolation layer 102p is formed in the peripheral regions 2 and 3. In addition, the semiconductor layer 100 may further include an impurity region, which may be used as a source and/or drain region (hereinafter, referred to as a source/drain region) and a channel region formed between the source/drain regions. Moreover, a typical pad oxide layer may be further formed on the semiconductor layer 100.

In the high-voltage peripheral region 3, the buffer insulating layer 104 may be further formed on the semiconductor layer 100. The buffer insulating layer 104 may be formed by, for example, dry oxidation or wet oxidation. The buffer insulating layer 104 may include at least one selected from the group consisting of, for example, a silicon oxide ($SiO_2$), a silicon nitride ($Si_3N_4$), and a silicon oxynitride (SiON).

Figure 7B:
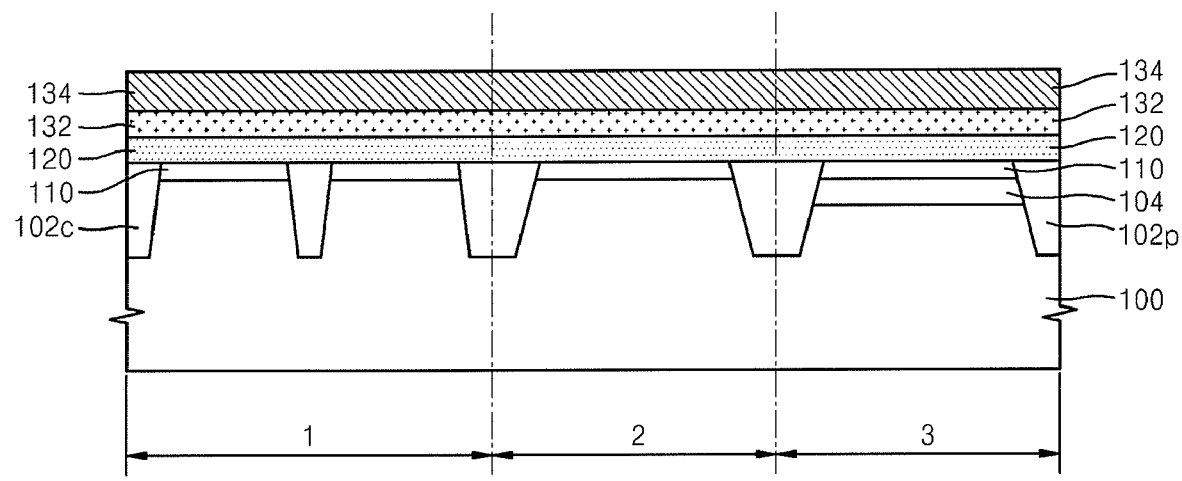

Referring to FIG. 7B, first, second, third, and fourth layers 110, 120, 132, and 134 are sequentially formed on the semiconductor layer 100 in the cell region 1 and the peripheral regions 2 and 3. Layers described below, including the first, second, third, and fourth layers 110, 120, 132, and 134, may be formed by Chemical Vapor Deposition (CVD), Low Pressure CVD (LPCVD), Plasma Enhanced CVD (PECVD), Atomic Layer Deposition (ALD), or sputtering. However, the method of forming the layers described below including the first, second, third, and fourth layers 110, 120, 132, and 134 is not limited to the above-listed methods.

The first layer 110 may be, for example, an insulation layer or a dielectric layer. The first layer 110 may have a single layer structure including at least one selected from the group consisting of, for example, a silicon oxide ($SiO_2$), a silicon nitride ($Si_3N_4$), a silicon oxynitride (SiON), a hafnium oxide ($HfO_2$), a hafnium silicon oxide ($HfSi_xO_y$), an aluminum oxide ($Al_2O_3$), and a zirconium oxide ($ZrO_2$), or a multi-layer structure including a stack of a plurality of layers each including at least one of the above-listed materials. The first layer 110 in the cell region 1 may be turned into, for example, a tunneling insulating layer 110c by subsequent processes. The first layer 110 in the peripheral regions 2 and 3 may constitute the low-voltage peripheral region gate insulating layer 110L and the high-voltage peripheral region gate insulating layer 110H.

The second layer 120 may be, for example, a conductive layer or a charge storage layer. The second layer 120 may have a single layer structure including at least one selected from the group consisting of, for example, polysilicon, a silicon oxide ($SiO_2$), a silicon nitride ($Si_3N_4$), a silicon oxynitride (SiON), a hafnium oxide ($HfO_2$), a zirconium oxide ($ZrO_2$), a tantalum oxide ($Ta_2O_3$), a titanium oxide ($TiO_2$), a hafnium aluminum oxide ($HfAl_xO_y$), a hafnium tantalum oxide ($HfTa_xO_y$), a hafnium silicon oxide ($HfSi_xO_y$), an aluminum nitride ($Al_xN_y$), and an aluminum gallium nitride (AlGaN), or a multi-layer structure including a stack of a plurality of layers each including at least one of the above-listed materials. The second layer 120 in the cell region 1 may be turned into the charge storage layer, such as, for example, a floating gate or a charge trap layer, by subsequent processes.

The third layer 132 may be, for example, an insulating layer or a dielectric layer. The third layer 132 may be a mono-layer including at least one selected from the group consisting of, for example, a silicon oxide, a carbon-doped silicon oxide, a fluorine-doped silicon oxide, and a porous silicon oxide, or a multilayer corresponding to a stack of a plurality of layers each including at least one of the above-listed materials.

The fourth layer 134 may be, for example, an insulating layer or a dielectric layer. The fourth layer 134 may include, for example, a high-k dielectric. The fourth layer 134 may have a single layer structure including at least one selected from the group consisting of, for example, an aluminum oxide ($Al_2O_3$), a titanium oxide ($Ta_2O_3$), a titanium oxide ($TiO_2$), a yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide (LaAlO), a lanthanum hafnium oxide (LaHfO), a hafnium aluminum oxide (HfAlO), and a praseodymium oxide ($Pr_2O_3$), or a multi-layer structure including a stack of a plurality of layers each including at least one of the above-listed materials.

Figure 7C:
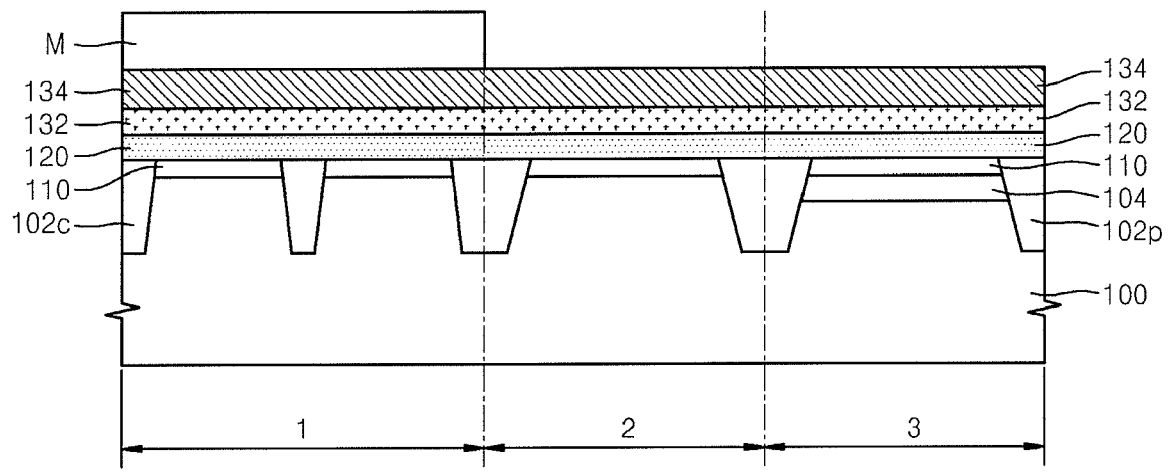

Referring to FIG. 7C, a mask layer M is formed to cover the cell region 1 and expose the peripheral regions 2 and 3. The mask layer M may be, for example, a hard mask, a photoresist mask, or a combination thereof.

Figure 7D:
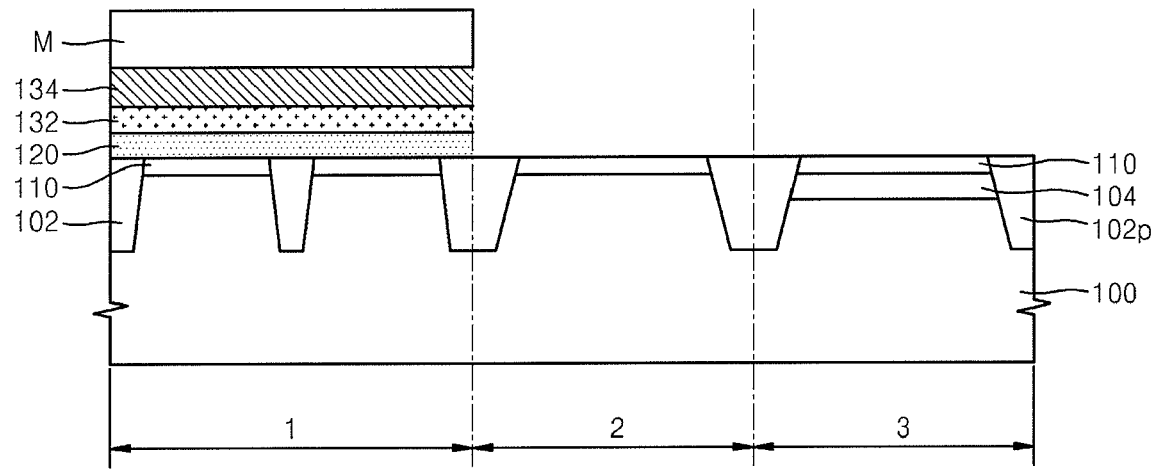

Referring to FIG. 7D, the second layer 120, the third layer 132, and the fourth layer 134 in the peripheral regions 2 and 3 are removed using the mask layer M as an etch mask, thereby exposing the first layer 110 in the peripheral regions 2 and 3. At this time, in the cell region 1, the first, second, third, and fourth layers 110, 120, 132, and 134 remain.

Figure 7E:
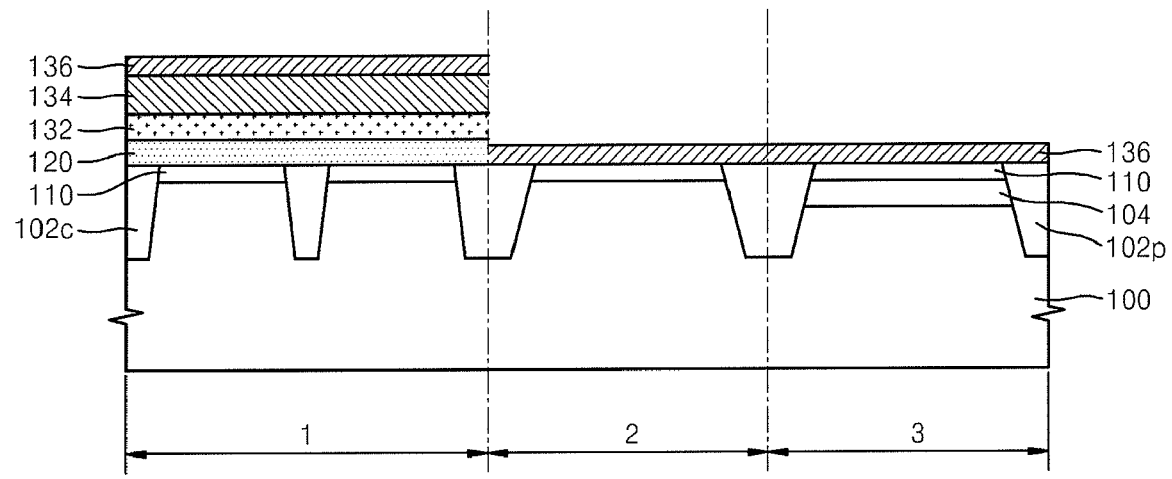

Referring to FIG. 7E, a fifth layer 136 is formed on the fourth layer 134 in the cell region 1 and on the first layer 110 exposed in the peripheral regions 2 and 3. A portion of the fifth layer 136 in the cell region 1 and a portion of the fifth layer 136 in the peripheral regions 2 and 3 may be formed in a same process or separately formed in different processes.

The fifth layer 136 may be, for example, an insulating layer or a dielectric layer. The fifth layer 136 may include, for example, a high-k dielectric. The fifth layer 136 may have a single layer structure including at least one selected from the group consisting of, for example, an aluminum oxide ($Al_2O_3$), a titanium oxide ($Ta_2O_3$), a titanium oxide ($TiO_2$), a yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide (LaAlO), a lanthanum hafnium oxide (LaHfO), a hafnium aluminum oxide (HfAlO), and a praseodymium oxide ($Pr_2O_3$), or a multi-layer structure including a stack of a plurality of layers each including at least one of the above-listed materials. The fourth layer 134 and the fifth layer 136 may be formed of the same material or different materials from one another. A thickness of the fourth layer 134 may be equal to or greater than that of the fifth layer 136. For example, the thickness of the fourth layer 134 may be in the range of 30 Å to 60 Å, and the thickness of the fifth layer 136 may be in the range of 5 Å to 20 Å.

Figure 7F:
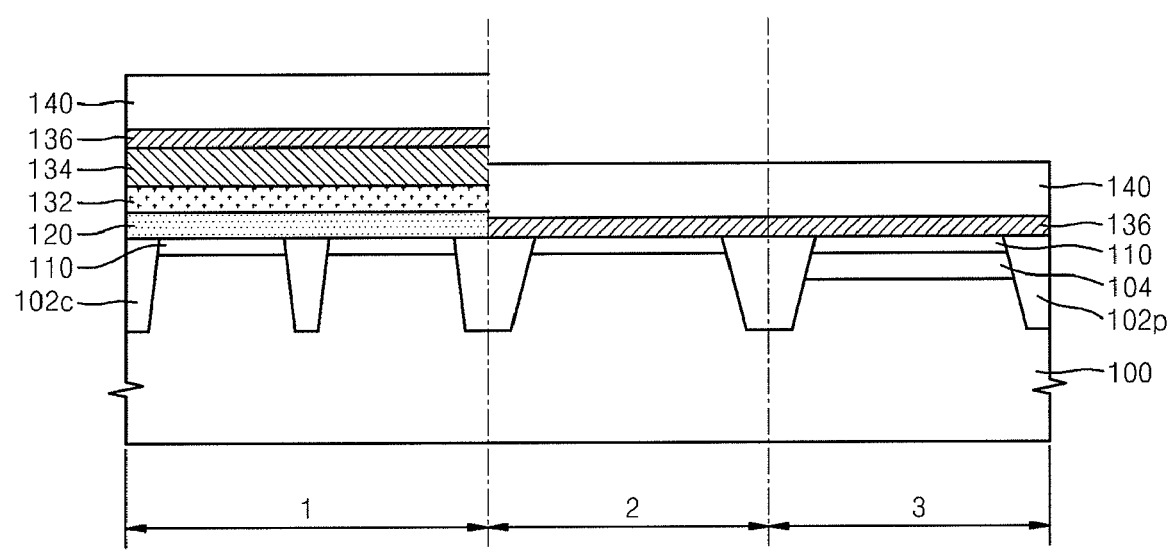

Referring to FIG. 7F, a sixth layer 140 is formed on the portion of the fifth layer 136 in the cell region 1 and on the portion of the fifth layer 136 in the peripheral regions 2 and 3. The portions of the sixth layer 140 in the cell region 1 and in the peripheral regions 2 and 3 may be formed in the same process or separately formed. The sixth layer 140 may be a conductive layer. The sixth layer 140 may have a single layer structure including at least one selected from the group consisting of, for example, polysilicon, aluminum (Al), gold (Au), beryllium (Be), bismuth (Bi), cobalt (Co), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), zirconium (Zr), nitrides of the above-listed materials, and silicides of the above-listed materials, or a multi-layer structure including a stack of a plurality of layers each including at least one of the above-listed materials. In addition, a capping layer may be further formed on the sixth layer 140 in the cell region 1 and the peripheral regions 2 and 3. The capping layer may include at least one selected from the group consisting of, for example, a silicon oxide ($SiO_2$), a silicon nitride ($Si_3N_4$), and a silicon oxynitride (SiON).

Figure 7G:
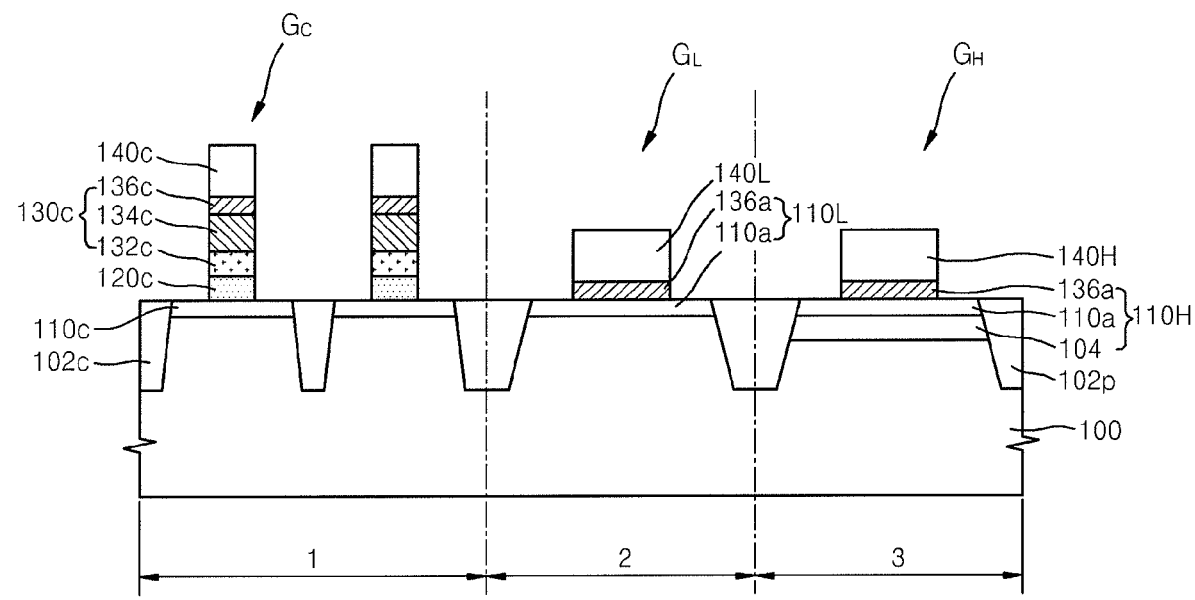

Referring to FIG. 7G, the cell region gate structure $G_C$ is formed by removing parts of the second through sixth layers 120, 132, 134, 136, and 140 formed in the cell region 1. The peripheral region gate structures $G_L$ and $G_H$ are formed by removing parts of the fifth and sixth layers 136 and 140 formed in the peripheral regions 2 and 3. Also, spacers may be formed on sidewalls of the gate structures $G_C$, $G_L$, and $G_H$.

In the cell region gate structure $G_C$, the first layer 110 forms the tunneling insulating layer 110c, the second layer 120 forms the charge storage layer 120c, the third, fourth, and fifth layers 132, 134, and 136 form the blocking insulating layer 130c, and the sixth layer 140 forms the cell region gate electrode layer 140c. The blocking insulating layer 130c may include the first, second, and third blocking insulating layers 132c, 134c, and 136c into which the third layer 132, the fourth layer 134, and the fifth layer 136 are turned, respectively. As described above, the thickness of the second blocking insulating layer 134c may be equal to or greater than that of the third blocking insulating layer 136c.

In the low-voltage peripheral region gate structure $G_L$, the first layer 110 and the fifth layer 136 form the low-voltage peripheral region gate insulating layer 110L, and the sixth layer 140 forms the low-voltage peripheral region gate electrode layer 140L. The low-voltage peripheral region gate insulating layer 110L may include the first peripheral region insulating layer 110a and the second peripheral region insulating layer 136a into which the first layer 110 and the fifth layer 136 are turned, respectively. As described above, the second peripheral region insulating layer 136a and the third blocking insulating layer 136c may be formed in the same process and may include the same material and/or have the same thickness.

In the high-voltage peripheral region gate structure $G_H$, the high-voltage peripheral region gate insulating layer 110H may include the buffer insulating layer 104, the first peripheral region insulating layer 110a, and the second peripheral region insulating layer 136a. The first peripheral region insulating layer 110a and the second peripheral region insulating layer 136a may correspond to the first layer 110 and the fifth layer 136, respectively. As the high-voltage peripheral region gate insulating layer 110H may further include the buffer insulating layer 104 compared with the low-voltage peripheral region gate electrode layer 140L, the high-voltage peripheral region gate insulating layer 110H may be thicker than the low-voltage peripheral region gate electrode layer 140L.

The above-described non-volatile memory device is just an example. For example, the cell region gate structure $G_C$ may be NAND memory cells or NOR memory cells.

A method of manufacturing a non-volatile memory device according to the inventive concept includes the operations of: providing a semiconductor layer including a cell region and a peripheral region, sequentially forming a tunneling insulating layer, a charge storage layer, a first blocking insulating layer, and a second blocking insulating layer in the cell region and the peripheral region, forming a mask layer that covers the cell region and exposes the peripheral region, removing the charge storage layer, the first blocking insulating layer, and the second blocking insulating layer in the peripheral region by using the mask layer as an etch mask, forming a third blocking insulating layer on the second blocking insulating layer in the cell region and on the tunneling insulating layer exposed in the peripheral region and forming a gate electrode layer on the third blocking insulating layer in the cell region and on the third blocking insulating layer in the peripheral region.

Figure 8:
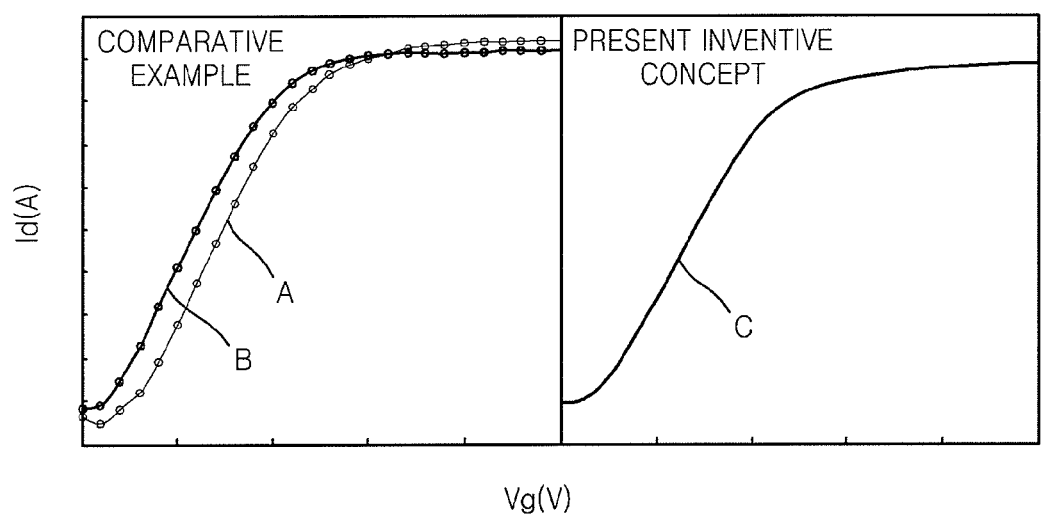
FIG. 8 illustrates two graphs respectively showing a relationship between a gate voltage Vg and a drain current Id of a non-volatile memory device constituting a comparative example (on the left) and a non-volatile memory device according to an exemplary embodiment of the inventive concept (on the right).

FIG. 8 illustrates two graphs respectively showing a relationship between a gate voltage Vg and a drain current Id of a non-volatile memory device constituting a comparative example (on the left) and a non-volatile memory device according to an embodiment of the inventive concept (on the right). The comparative example has a structure in which same gate structures are formed in a cell region and a peripheral region, respectively. In other words, in the comparative example, the gate structure of the peripheral region further includes a charge storage layer and first and second blocking insulating layers compared with the gate structure of the cell region.

Referring to FIG. 8, as for the operational characteristics of the comparative example, a relationship between a gate voltage Vg and a drain current Id during an initial operation is expressed as a plot A, and a relationship between a gate voltage Vg and a drain current Id in subsequent operations is expressed as a plot B. This is because holes are trapped in an insulating layer of the gate structure of the peripheral region due to gate induced drain leakage (GIDL). On the other hand, in the non-volatile memory device according to the inventive concept, both a relationship between a gate voltage Vg and a drain current Id in an initial operation and a relationship between a gate voltage Vg and a drain current Id in subsequent operations are expressed as a plot C and thus coincide with each other. Therefore, holes may be prevented from being trapped in the insulating layer, because a gate insulating layer including a high-k dielectric has a relatively small thickness.

As described above, the cell region gate structure $G_C$ and the peripheral region gate structures $G_L$ and $G_H$ may be formed in the same process, and have a small step difference compared with conventional gate structures. In addition, a contact hole connected to the gate structure of a cell region and a contact hole connected to the gate structure of a peripheral region may be formed in the same process. In the method of manufacturing the non-volatile memory device according to the inventive concept, the number of processes to be performed may be reduced compared with the conventional art. The non-volatile memory device according to the inventive concept may include a gate electrode including metal, and have high reliability.

Figure 9:
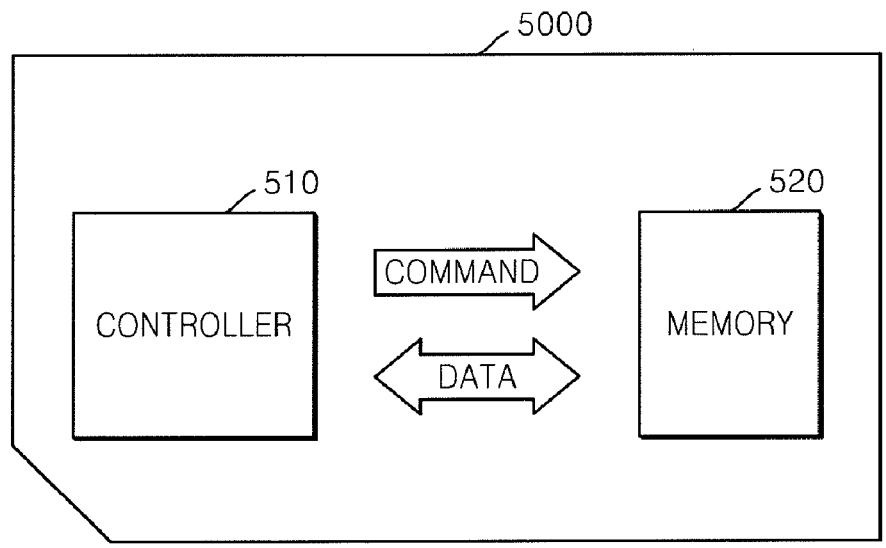
FIG. 9 is a schematic diagram of a memory card according to an exemplary embodiment of the inventive concept.

FIG. 9 is a schematic view illustrating an embodiment of a memory card 5000 according to an aspect of the present invention.

Referring to FIG. 9, a controller 510 and a memory 520 are disposed to send/receive electric signals to/from each other. For example, when the controller 510 gives a command to the memory 520, the memory 520 can send data. The memory 520 can include the non-volatile memory device 100 according to an embodiment of the present invention. The non-volatile memory devices according to the various embodiments of the present invention can be disposed in NAND or NOR architecture arrays in correspondence to the logic gate design. Such NAND and NOR arrays are generally known in the art. The memory arrays disposed in a plurality of rows and columns can have, for example, one or more memory array banks. The memory 520 can include, for example, the memory array or the memory array bank, all of which are known in the art. The memory card 5000 can further include conventional members, such as, for example, a conventional row decoder, a column decoder, input/output (I/O) buffers, and/or a control resistor to drive the memory array bank, all of which are known in the art. The memory card 5000 can be used in memory devices as a memory card, for example, such as a memory stick card, a smart media (SM) card, a secure digital (SD) card, a mini SD card, or a multi media card (MMC).

Figure 10:
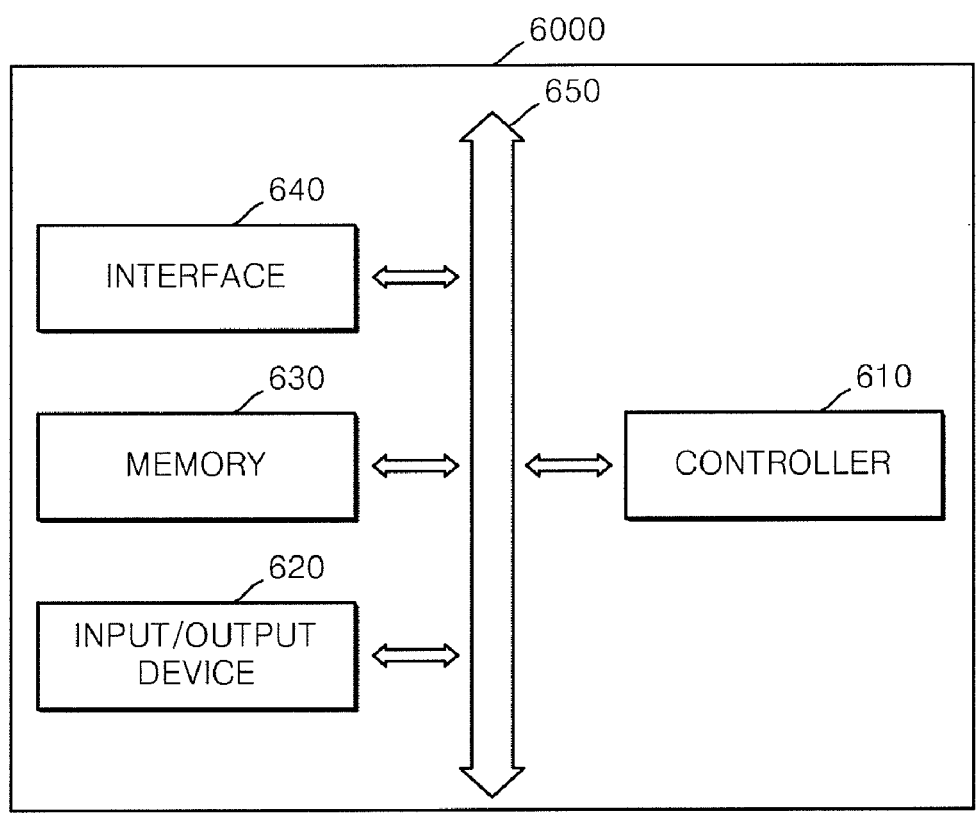
FIG. 10 is a schematic diagram of a system according to an exemplary embodiment of the inventive concept.

FIG. 10 is a schematic diagram of a system 6000 including a non-volatile memory device according to an embodiment of the present invention.

Referring to FIG. 10, the system 6000 may include, for example, a controller 610, an input/output device 620, a memory 630, and an interface 640. The system 6000 may be, for example, a mobile system or a system that transmits or receives data. The mobile system may be, for example, a personal digital assistant (PDA), a portable computer, a web tablet, a wireless phone, a mobile phone, a digital music player, or a memory card. The controller 610 executes a software program and controls the system 6000. The controller 610 may be, for example, a microprocessor, a digital signal processor, a microcontroller, or the like. The input/output device 630 can be used, for example, to input or output data of the system 6000. The system 6000 is connected to an external apparatus, for example, a personal computer or a network, using the input/output device 620, to send/receive data to/from the external apparatus. The input/output device 620 may be, for example, a keypad, a keyboard, or a display. The memory 630 may store codes and/or data for operating the controller 610 and/or may store data processed by the controller 610. The memory 630 may include a non-volatile memory device according to an embodiment of the present invention. The interface 640 may be, for example, a data transmission path between the system 6000 and an external apparatus. The controller 610, the input/output device 620, the memory 630, and the interface 640 may communicate with one another by, for example, a bus 650. For example, the system 6000 can be used for a mobile phone, a MP3 player, a navigation system, a portable multimedia player (PMP), a solid state disk (SSD), or a household appliance.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A non-volatile memory device comprising:
   a semiconductor layer comprising a cell region and a peripheral region;
   a cell region gate structure disposed in the cell region of the semiconductor layer, wherein the cell region gate structure comprises a tunneling insulating layer and a first blocking insulating layer, a second blocking insulating layer, and a third blocking insulating layer; and
   a peripheral region gate structure formed in the peripheral region of the semiconductor layer, wherein the peripheral region gate structure comprises a first peripheral region insulating layer comprising a same material as a material included in the tunneling insulating layer and a second peripheral region insulating layer comprising a same material as a material included in the third blocking insulating layer.

2. The non-volatile memory device of claim 1, wherein the first peripheral region insulating layer and the second peripheral region insulating layer constitute a peripheral region gate insulating layer.

3. The non-volatile memory device of claim 1, wherein a thickness of the third blocking insulating layer is equal to a thickness of the second peripheral region insulating layer.

4. The non-volatile memory device of claim 1, wherein a thickness of the second blocking insulating layer is equal to or greater than a thickness of the third blocking insulating layer.

5. The non-volatile memory device of claim 1, wherein the second blocking insulating layer and the third blocking insulating layer each comprise a same material as one another.

6. The non-volatile memory device of claim 1, wherein the second blocking insulating layer and the third blocking insulating layer each comprise different materials from one another.

7. The non-volatile memory device of claim 1, wherein at least one of the second blocking insulating layer and the third blocking insulating layer comprises at least one selected from the group consisting of an aluminum oxide ($Al_2O_3$), a tantalum oxide ($Ta_2O_3$), a titanium oxide ($TiO_2$), a yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide (LaAlO), a lanthanum hafnium oxide (LaHfO), a hafnium aluminum oxide (HfAlO), and a praseodymium oxide ($Pr_2O_3$).

8. The non-volatile memory device of claim 1, wherein the peripheral region comprises a low-voltage peripheral region and a high-voltage peripheral region.

9. The non-volatile memory device of claim 8, wherein the high-voltage peripheral region further comprises a buffer insulating layer disposed between the semiconductor layer and the first peripheral region insulating layer.

10. The non-volatile memory device of claim 1, wherein the third blocking insulating layer and the second peripheral region insulating layer are formed in a same process as one another.

11. The non-volatile memory device of claim 1, wherein a thickness of the tunneling insulating layer is equal to a thickness of the first peripheral region insulating layer.

12. The non-volatile memory device of claim 1, wherein the first blocking insulating layer comprises a silicon oxide.

13. The non-volatile memory device of claim 1, further comprising:
   a cell region gate electrode layer disposed on the third blocking insulating layer;
   and
   a peripheral region gate electrode layer disposed on the second peripheral region insulating layer.

14. The non-volatile memory device of claim 13, wherein the cell region gate electrode layer and the peripheral region gate electrode layer are formed in a same process as one another.

15. The non-volatile memory device of claim 1, wherein the cell region further comprises a charge storage layer disposed between the tunneling insulating layer and the first blocking insulating layer.

16. A non-volatile memory device comprising:
   a semiconductor layer comprising a first region and a second region;
   a first region gate structure disposed in the first region of the semiconductor layer, wherein the first region gate structure comprises a plurality of first region insulating layers including at least two blocking including layers, wherein the at least two blocking insulating layers each comprise a high-k dielectric material; and
   a second region gate structure formed in the second region of the semiconductor layer, wherein the second region gate structure comprises a plurality of second region insulating layers that comprise at least one of the plurality of first region insulating layers.

17. The non-volatile memory device of claim 16, wherein the second region insulating layers comprise a high-k dielectric insulating layer comprising a high-k dielectric material.

18. The non-volatile memory device of claim 17, wherein one the at least two blocking insulating layers included in the first region insulating layers and the high-k dielectric insulating layer included in and the second region insulating layers have a same thickness as one another in both the first region and the second region.

19. A non-volatile memory device comprising:
   a semiconductor layer comprising a cell region and a peripheral region;
   a cell region gate structure disposed in the cell region of the semiconductor layer, wherein the cell region gate structure comprises a tunneling insulating layer, a charge storage layer, a first blocking insulating layer, a second blocking insulating layer, a third blocking insulating layer, and a gate electrode layer wherein the second blocking insulating layer and the third blocking insulating layer each comprise a high-k dielectric material; and a peripheral region gate structure formed in the peripheral region of the semiconductor layer, wherein the peripheral region gate structure comprises the tunneling insulating layer, the third blocking insulating layer, and the gate electrode layer.

* * * * *